(12) United States Patent
Lin et al.

(10) Patent No.: US 10,737,932 B2
(45) Date of Patent: Aug. 11, 2020

(54) MICRO-ELECTRO-MECHANICAL SYSTEM STRUCTURE AND METHOD FOR FABRICATING THE SAME

(71) Applicant: UNITED MICROELECTRONICS CORP., Hsinchu (TW)

(72) Inventors: Yuan-Sheng Lin, Taoyuan (TW); Jung-Hao Chang, Taoyuan (TW); Chang-Sheng Hsu, Hsinchu (TW); Weng-Yi Chen, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/284,735

(22) Filed: Feb. 25, 2019

(65) Prior Publication Data

US 2020/0223687 A1    Jul. 16, 2020

(30) Foreign Application Priority Data

Jan. 14, 2019    (CN) .......................... 2019 1 0031754

(51) Int. Cl.
*B81B 7/00*    (2006.01)
*B81C 1/00*    (2006.01)

(52) U.S. Cl.
CPC ........ *B81B 7/0061* (2013.01); *B81C 1/00309* (2013.01); *B81B 2201/0257* (2013.01); *B81B 2203/0127* (2013.01); *B81B 2203/0315* (2013.01); *B81C 2201/0132* (2013.01); *B81C 2201/0133* (2013.01)

(58) Field of Classification Search
CPC .......... B81B 7/0061; B81B 2201/0257; B81B 2203/0127; B81B 2203/0315; B81C 1/00309; B81C 2201/0132; B81C 2201/0133
USPC ....................................................... 257/415
See application file for complete search history.

(56) References Cited

U.S. PATENT DOCUMENTS

| 7,951,636 | B2 | 5/2011 | Lee et al. |
| 8,368,153 | B2 | 2/2013 | Huang et al. |
| 8,464,589 | B2 | 6/2013 | Lee et al. |
| 2017/0203961 | A1* | 7/2017 | Chang ................... B81B 3/0021 |
| 2018/0022603 | A1* | 1/2018 | Chu ..................... B81C 1/00825 257/416 |

* cited by examiner

*Primary Examiner* — Tu-Tu V Ho
(74) *Attorney, Agent, or Firm* — WPAT, PC (57) ABSTRACT

A MEMS structure includes a substrate, a dielectric layer, a membrane, a backplate, and a blocking layer. The substrate has a through-hole. The dielectric layer is disposed on the substrate and has a cavity in communication with the through-hole. The membrane has at least one vent hole, is embedded in the dielectric layer and together with the dielectric layer defines a first chamber that communicates with the through-hole. The backplate is disposed on the dielectric layer. One end of the blocking layer is embedded in the dielectric layer, and the other end of the blocking layer extends into the cavity; the blocking layer is spatially isolated from the membrane and at least partially overlaps with the at least one vent hole.

18 Claims, 6 Drawing Sheets

MICRO-ELECTRO-MECHANICAL SYSTEM STRUCTURE AND METHOD FOR FABRICATING THE SAME

This application claims the benefit of People's Republic of China application Serial No. 201910031754.6, filed Jan. 14, 2019, the subject matter of which is incorporated herein by reference.

BACKGROUND

Technical Field

The disclosure relates in semiconductor device and the method for fabricating the same, and more particularly to a micro-electro-mechanical system (MEMS) device and the method for fabricating the same.

Description of

With the improvement of technology, the design trend of consumer electronic products is constantly developed in a manner of miniaturization and multiple functions. A MEMS device formed by semiconductor fabrication processes or other micro-precision techniques, while integrating various functions, such as electronics, motors or machinery functions, in one single structure is thus provided.

To take a MEMS microphone as an example, that has advantages of small size, low power consumption, better suppression of interference to the surrounding environment, and the capability for forming by using automatic surface-mount technology (SMT) has been widely used in portable electric products, such as mobile phones and notebook computers, MP3 players and personal digital assistants (PDAs).

A typical MEMS microphone includes a basic capacitor structure mainly composed by two conductive plates and an insulating air layer disposed there between. These two conductive plates are respectively a membrane and a backplate, wherein the membrane is a very soft elastic film. When the membrane is subjected to sound pressure, vibrations which can cause a micro-distance change or result in dynamic micro-displacement between the membrane and the back plate may occur, the capacitance value of the capacitor structure can vary by the micro-distance change or the micro-displacement, and the change in capacitance value can be used for measuring the wave variation.

Since the gap between the membrane and the backplate is relatively short, thus when the membrane vibrates resulted from the sound waves and the air flow in the gap, the viscosity of the air flow may generate a resistant force against the vibration movement of the membrane, so as to result in a mechanical noise, the major noise source of the overall microphone structure. In order to solve this problem, at least one slit or a vent hole is formed in the membrane to balance the sound pressure in the MEMS microphone to improve the signal-to-noise ratio (SNR). However, the forming of the slit or vent hole can significantly affect the frequency response of the MEMS microphone, so that when the microphone receives a lower frequency sound, the signal sensed by the system output will attenuate earlier, resulting a low frequency roll-off problem.

Therefore, there is a need of providing an improved MEMS device and the method for fabricating the same to obviate the drawbacks encountered from the prior art.

SUMMARY

One aspect of the present disclosure is to provide a MEMS structure, wherein the MEMS structure includes a substrate, a dielectric layer, a membrane, a backplate, and a blocking layer. The substrate has a through-hole. The dielectric layer is disposed on the substrate and has a cavity in communication with the through-hole. The membrane has at least one vent hole, is embedded in the dielectric layer and together with the dielectric layer defines a first chamber that communicates with the through-hole. The backplate is disposed on the dielectric layer. One end of the blocking layer is embedded in the dielectric layer, and the other end of the blocking layer extends into the cavity; the blocking layer is spatially isolated from the membrane and at least partially overlaps with the at least one vent hole.

Another aspect of the present disclosure is to provide a method for fabricating a MEMS structure, wherein the method includes steps as follows: A dielectric layer is firstly formed on a substrate, and a membrane embedded in the dielectric layer is then formed, wherein the membrane has at least one vent hole. Next, a blocking layer embedded in the dielectric layer is formed, wherein the blocking layer is disposed between the substrate and the membrane or disposed on one side of the membrane away from the substrate, is spatially isolated from the membrane and at least partially overlaps the vent hole. Subsequently, a backplate is formed on the dielectric layer, a through-hole is then formed in the substrate to expose a portion of the dielectric layer. The backplate is patterned to form at least one penetrating opening aligning the through-hole and exposing a portion of the dielectric layer. Thereafter, a portion of the dielectric layer is removed from the through-hole, the at least one penetrating opening and the at least one vent hole to form a first chamber between the membrane and the substrate.

In accordance with the aforementioned embodiments of the present disclosure, a MEMS device and the method for fabricating the same are provided. A blocking layer is formed between a substrate and a membrane or formed on one side of the membrane away from the substrate to make it not connected to (spatially isolated from) the membrane but at least partially overlapping with at least one vent hole formed in the membrane. Since there is no substantial substance blocking between the blocking layer and the membrane, thus the functions of the vent hole to balance the sound pressure and reduce mechanical noise cannot be affected. Moreover, through the indirect obstacle of the blocking layer, the sound energy dissipation can be delayed and the low frequency roll-off caused by the vent holes can be alleviated. Therefore, the SNR and the performance of the MEMS structure can be significantly improved while taking into account the frequency response.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

The embodiments as illustrated below provide a MEMS structure and the method for fabricating the same to reduce mechanical noise and to solve the low frequency roll-off problem. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1A to 1D are cross-sectional views illustrating a series of processing structure for fabricating a MEMS structure 100 in accordance with one embodiment of the present disclosure. In the present embodiment, the method for fabricating the MEMS structure 100 includes steps as follows: A dielectric layer 102 is firstly formed on a substrate 101, and a membrane 103 embedded in the dielectric layer 102 is then formed, wherein the membrane 103 has at least one vent hole 103a. Next, a blocking layer 104 embedded in the dielectric layer 102 is formed, wherein the blocking layer 104 is disposed between the substrate 101 and the membrane 103 or disposed on one side of the membrane 103 away from the substrate 101. The blocking layer 104 is spatially isolated from the membrane 103 and at least overlaps a portion of the vent hole 103a.

In some embodiments of the present disclosure, the substrate 101 can be a semiconductor substrate, such as a silicon (Si) substrate, a germanium (Ge) substrate or a combination thereof. The dielectric layer 102 can be a composite layer formed by a plurality of fabrication steps, and the processing steps for forming the dielectric layer 102 and the processing steps for forming the membrane 103 and the blocking layer 104 are performed interlacedly. For example, in the present embodiment, the forming of the dielectric layer 102, the membrane 103, and the blocking layer 104 includes steps as follows:

Firstly, a dielectric film 102a is formed on a surface 101a of the substrate 101 by a deposition or coating process. The membrane 103 is then formed on the dielectric film 102a (see FIG. 1A). The dielectric film 102a is made of a dielectric material, such as silicon oxide (SiOx), silicon carbide (SiC), silicon oxycarbide (SiCO), silicon nitride (SiN), silicon oxynitride (SiNO), the arbitrary combinations thereof or other suitable dielectric material. In the present embodiment, the dielectric film 102a may be a silicon dioxide ($SiO_2$) film.

Figure 1A:
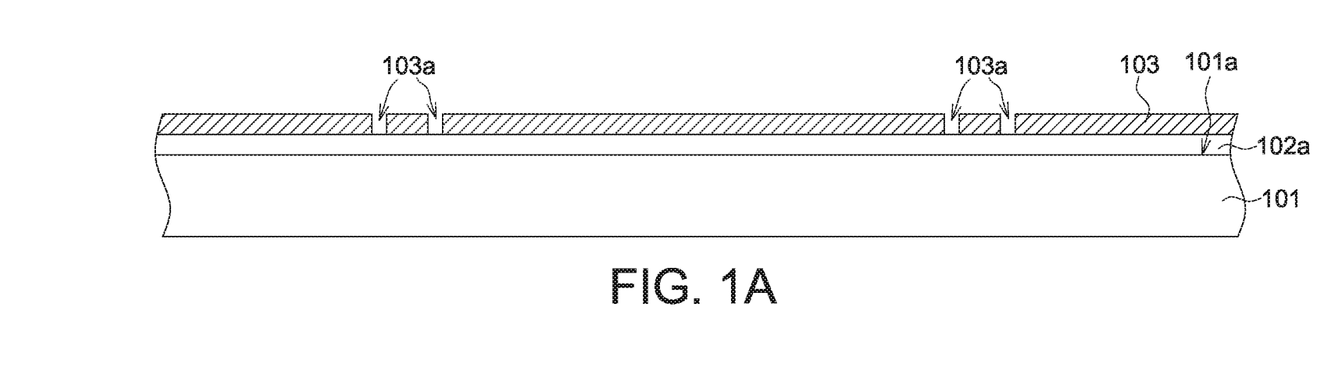
FIG. 1A to 1D are cross-sectional views illustrating a series of processing structure for fabricating a MEMS structure in accordance with one embodiment of the present disclosure.

The forming of the membrane 103 includes steps as follows: A conductive material layer (not shown) is formed over the dielectric film 102a by a coating or deposition process. The conductive material layer is then patterned by a photolithography etching process to form a plurality of vent holes 103a penetrating the conductive material layer. The membrane 103 can be made of a conductive material, for example, a metal (including, but not limited to, gold (G), silver (Ag), copper (Cu), aluminum (Al) or the arbitrary alloys thereof), a doped semiconductor material (including doped polysilicon or other suitable material), a metal oxide (including Indium Tin Oxide (ITO) or other suitable material) or a combination thereof. In the present embodiment, the membrane 103 can be a copper film. The vent holes 103a may be strip-shaped slits, circular through-holes or other shaped openings passing through the membrane 103.

Next, another dielectric film 102b is formed to cover the membrane 103, and the vent holes 103a are filled. A blocking layer 104 is formed over the dielectric film 102b (see FIG. 1B). In some embodiments of the present disclosure, the material constituting the dielectric film 102b may be the same as the material constituting the dielectric film 102a. In the present embodiment, the material constituting the dielectric film 102b is $SiO_2$.

Figure 1B:
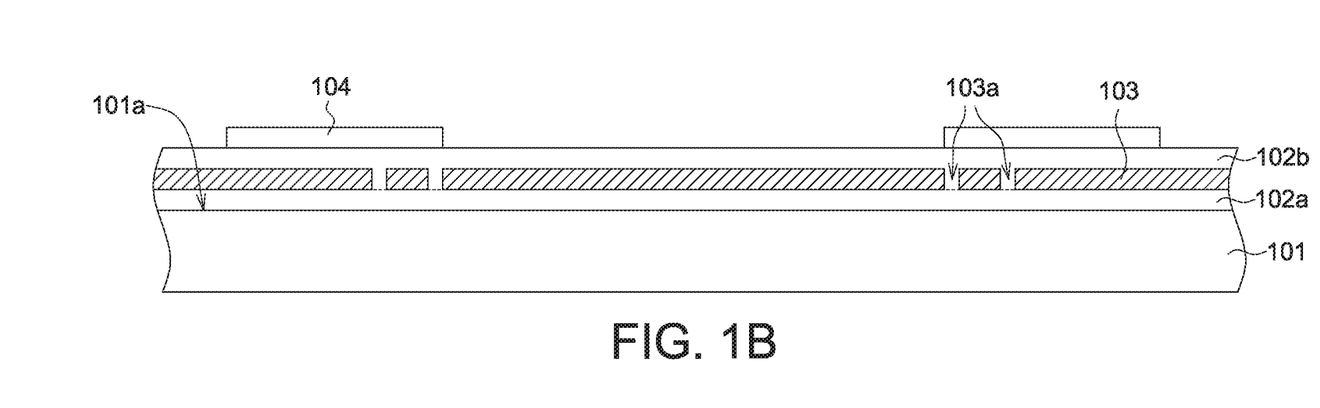

In some embodiments of the present disclosure, the forming of the blocking layer 104 includes steps as follows: Firstly, a dielectric material layer (not shown) made of a material different from that of the dielectric film 102b is formed on the dielectric film 102b by a deposition process. The dielectric material layer is then patterned by a photolithography etching process to defining the blocking layer 104 on the side of the membrane 103 away from the substrate 101. Wherein the blocking layer 104 is spatially isolated from the membrane 103 by the dielectric film 102b, and the blocking layer 104 at least partially overlaps with the went holes 103a of the membrane 103. In some embodiments of the present disclosure, the blocking layer 104 may be a single layer structure composed of a single material or a composite material layer having a multilayer structure.

The material constituting the blocking layer 104 may be polysilicon, amorphous silicon or a dielectric material other than silicon oxide (refer to as non-SiOx material), for example, silicon carbide, silicon oxycarbide, silicon nitride, silicon oxynitride, metal oxides, or other suitable materials. However, it should be appreciated that the material constituting the blocking layer 104 has a different etching selectivity than the material constituting the dielectric film 102b. When the dielectric film 102b is removed by an etching process (for example, a wet etching process), the removal rate of the same etchants used for removing the dielectric film 102b is greater than that for removing the blocking layer 104. For example, in the present embodiment, the blocking layer 104 can be made of silicon nitride, and the dielectric film 102b can be made of silicon dioxide. When an etchant containing hydrofluoric acid (HF) is used to remove the dielectric film 102b, the removal rate of the HF-containing etchant used for removing the dielectric film 102b is greater than the removal rate of the HF-containing etchant used for removing the blocking layer 104.

Figure 1C:
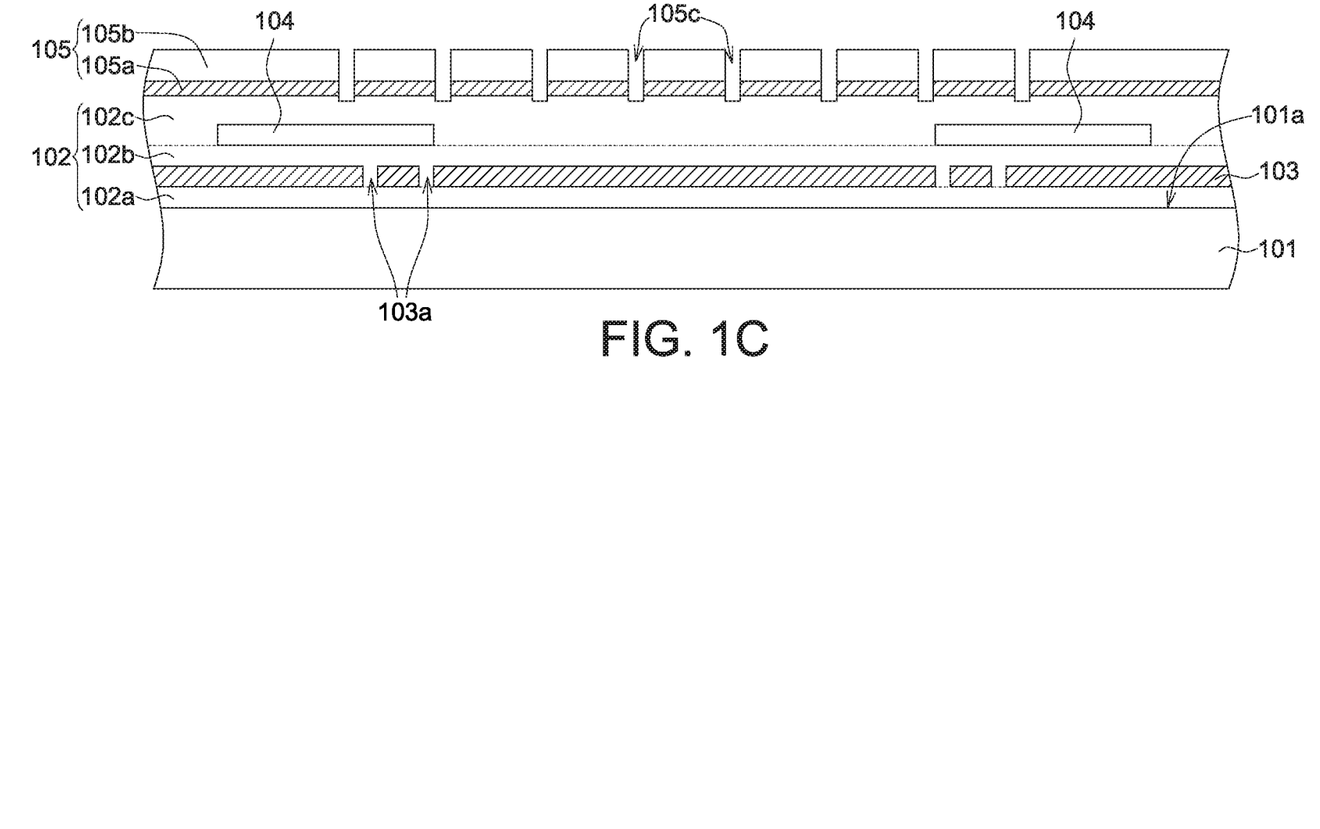

Subsequently, a dielectric material layer 102c is formed over the blocking layer 104, whereby the dielectric layer 102 is provided. A backplate 105 is then formed on the dielectric layer 102 (see FIG. 1O). In some embodiments of the present disclosure, the backplate 105 includes a conductive layer 105a and a dielectric protection layer 105b. The material constituting the conductive layer 105a may be the same as or different from the material constituting the membrane 103. The dielectric protection layer 105b may be a dielectric material layer and the material constituting the dielectric protection layer 105b is different from the material constituting the dielectric layer 102. In the present embodiment, the conductive layer 105a may be a patterned copper layer, and the dielectric protection layer 105b may be a silicon nitride hard mask layer.

The forming of the backplate 105 includes steps as follows: Firstly, a conductive material layer and a dielectric material layer are formed on the dielectric layer 102 in sequence by a deposition or coating process, and a photolithography etching process is then performed to form a plurality of penetrating openings 105c in the conductive material layer and the dielectric material layer, so as to expose a portion of the dielectric layer 102. In the present embodiment, a dry etching process, such as a reactive-ion etching (RIE) process, may be used to pattern the conductive material layer and the dielectric material layer.

Thereafter, a through-hole 101b is formed in the substrate 101 to expose a portion of the dielectric layer 102. A portion of the dielectric layer 102 is then removed by an etching process (for example, a wet etching process using an etchant containing HF) through the through-hole 101b, the penetrating openings 105c and the vent holes 103a, so as to expose a portion of the dielectric layer 102, a portion of the membrane 103, a portion of the blocking layer 104 and a portion of the backplate 105 and to form a cavity 106 in the dielectric layer 102, a first chamber 107 between the membrane 103 and the substrate 101 and a second chamber 108 between the membrane 103 and the backplate 105 (see FIG. 1D).

Figure 1D:
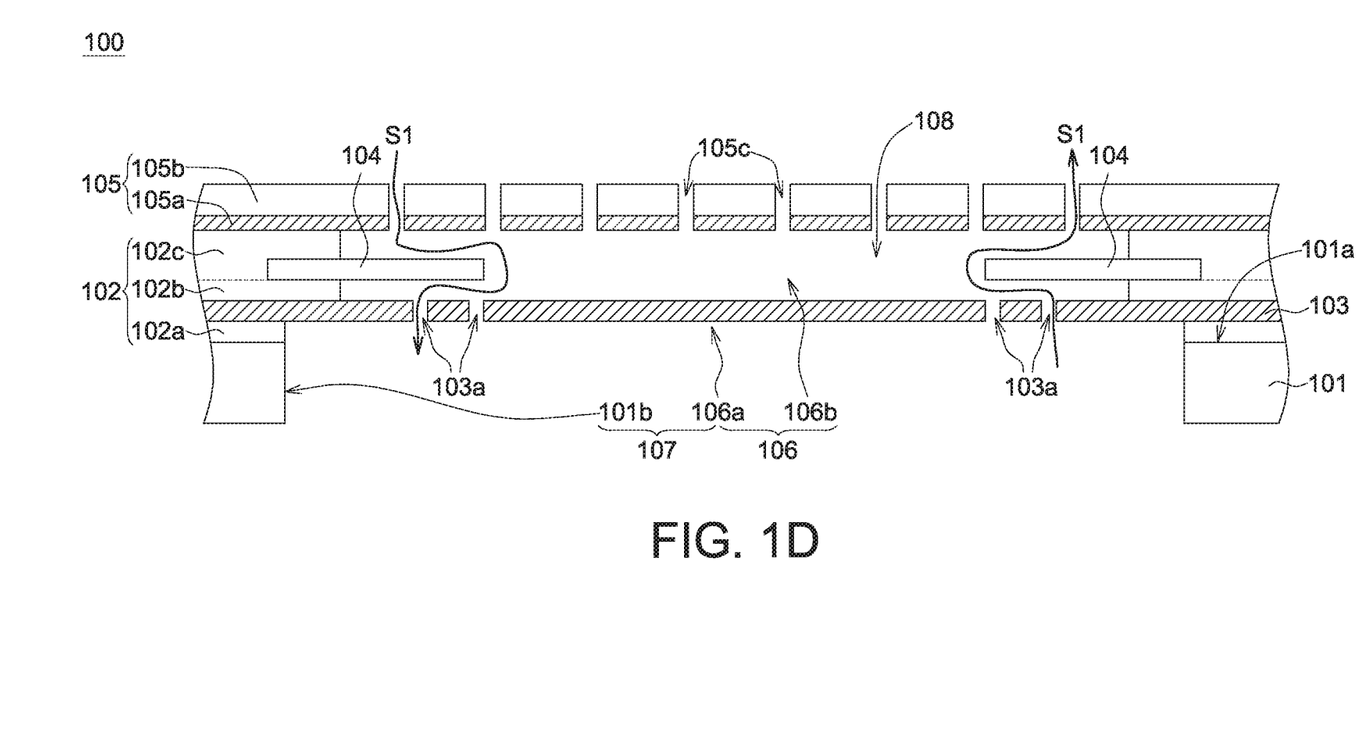

In detail, after the cavity 106 is formed, a portion of the membrane 103 is embedded in the dielectric layer 102; the other portion of the membrane 103 and all of the air holes 103a can be exposed through the cavity 106. The cavity 106 can be divided into two parts, i.e. a first portion 106a between the membrane 103 and the substrate 101 and a second portion 106b between the membrane 103 and the backplate 105, by the exposed portion of the membrane 103. Wherein, the first portion 106a of the cavity 106 communicates with the through-hole 101b to form the first chamber 107; the second portion 106b of the cavity 106 serves as the second chamber 108. In other words, the first chamber 107 is the space defined by the portions of sidewalls of the dielectric layer 102 and the membrane 103 exposed via the cavity 106 and the portion of the sidewalls of the substrate 101 exposed via the through-hole 101b. The chamber 108 is the space defined by the portions of sidewalls of the dielectric layer 102, the membrane 103, and the backplate 105 exposed through the cavity 106.

One end of the blocking layer 104 is embedded in the dielectric layer 102 and the other end of the blocking layer 104 extends into the second chamber 108. Since, when the cavity 106 is formed, the portion of the dielectric film 102b disposed between the blocking layer 104 and the membrane 103 has been removed by the wet etchant passing through the vent holes 103a, thus there is no substantial substance blocking between the first chamber 107 and the second chamber 108, even the vent holes 103a stilly overlap with a portion of the blocking layer 104. Such that, the air 51 in the first chamber 107 and the second chamber 108 can communicate with the external environment via the vent holes 103a, the penetrating openings 105c and the thought-hole 101b. Therefore, the sound pressure can be balanced, and the viscosity of the flowing air between the blocking layer 104 and the membrane 103 as well as the mechanical noise of the MEMS structure 100 can be reduced. Moreover, by the obstacle of the blocking layer 104, the attenuation of the sound pressure can be effectively reduced to alleviate the problem of the low frequency roll-off caused by the vent holes 103a. Therefore, the performance of the MEMS structure 100 can be improved while improving the SNR while taking into account the frequency response.

FIG. 2A to 2D are cross-sectional views illustrating a series of processing structure for fabricating a MEMS structure 200 in accordance with another embodiment of the present disclosure. The method for fabricating the MEMS structure 200 includes steps as follows: A dielectric film 202a is firstly formed on a surface 201a of a substrate 101, and a blocking layer 204 is then formed on the dielectric film 202 (see FIG. 2A).

Figure 2A:
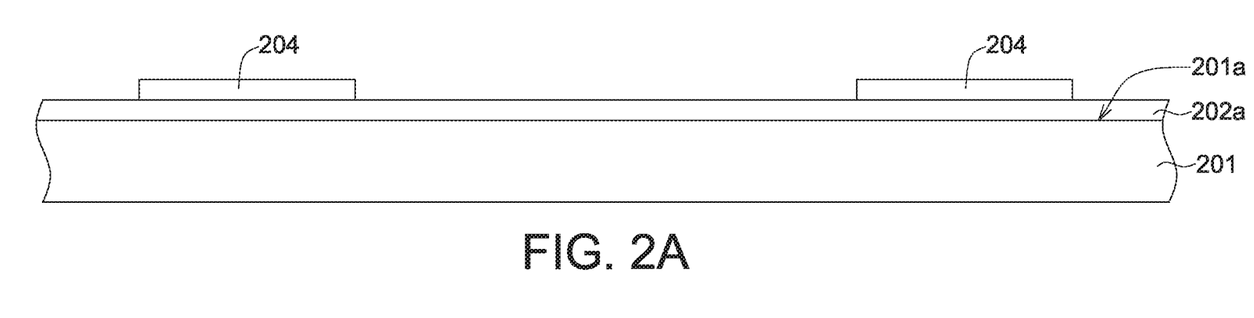
FIG. 2A to 2D are cross-sectional views illustrating a series of processing structure for fabricating a MEMS structure in accordance with another embodiment of the present disclosure.

In some embodiments of the present disclosure, the forming of the blocking layer 204 includes steps as follows: A dielectric material layer (not shown) made of a material different from that of the dielectric film 202b is formed on the dielectric film 202b by a deposition process. The dielectric material layer is then patterned by a photolithography etching process to defining the blocking layer 204.

Figure 2B:
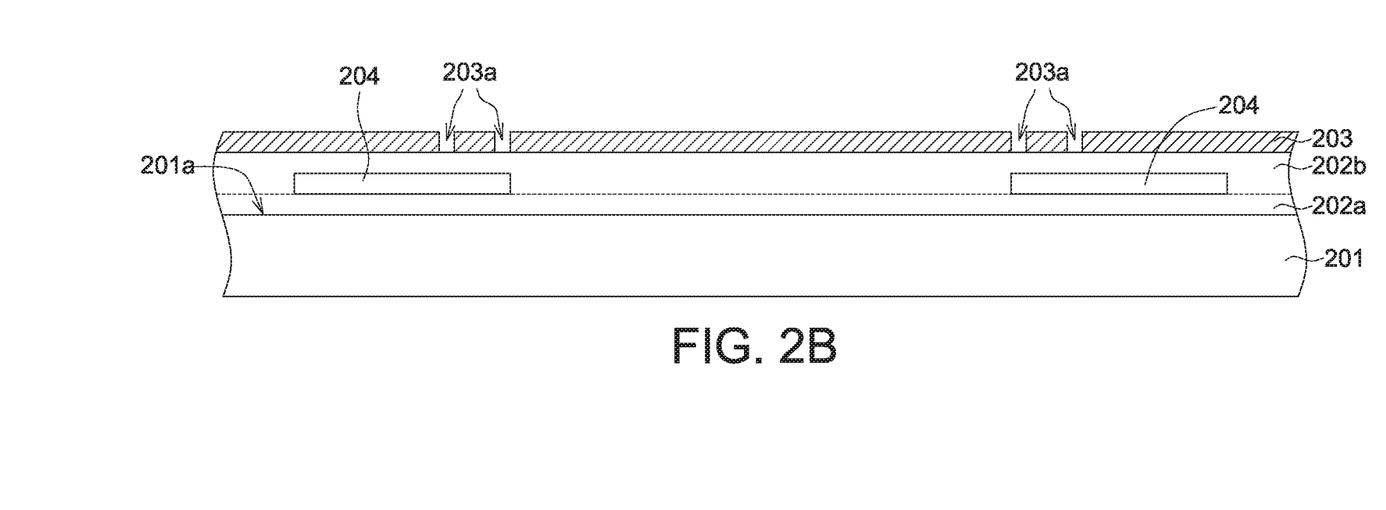

Next, another dielectric film 202b is formed on the blocking layer 204, and a membrane 203 is formed on the blocking layer 204, wherein the membrane 203 is spatially isolated from the blocking layer 204 by the dielectric film 202b (see FIG. 2B). The forming of the membrane 203 steps as follows: A conductive material layer (not shown) is firstly formed on the dielectric film 202b by a deposition process. Then, the conductive material layer is patterned by a photolithography etching process to form a plurality of vet holes 203a penetrating through the conductive material layer.

A dielectric material is formed over the membrane 203 to form a dielectric layer 202 and fill the vet holes 203a. A backplate 205 is then formed on the dielectric layer 202 (see FIG. 2C).

Figure 2C:
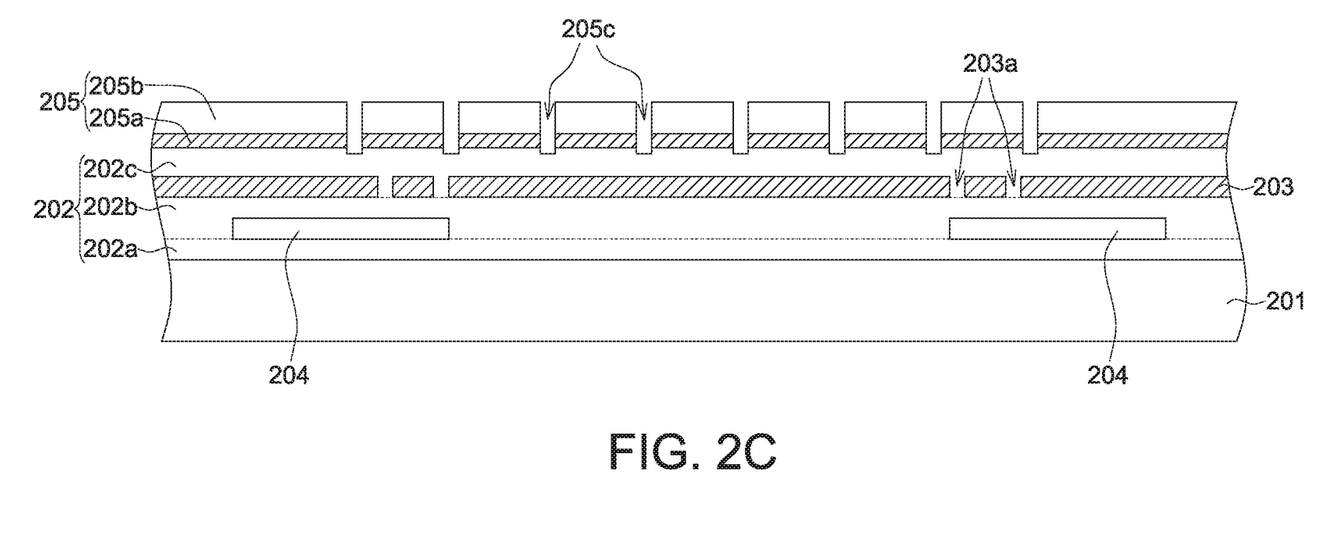

In some embodiments of the present disclosure, the backplate 205 includes a conductive layer 205a and a dielectric protection layer 205b. The forming of the backplate 205 includes steps as follows: Firstly, a conductive material layer and a dielectric material layer are formed on the dielectric layer 202 in sequence by a deposition or coating process, and a photolithography etching process is then performed to form a plurality of penetrating openings 205c in the conductive material layer and the dielectric material layer, so as to expose a portion of the dielectric layer 202. In the present embodiment, a dry etching process, such as a RIE process, may be used to pattern the conductive material layer and the dielectric material layer.

Thereafter, a through-hole 201b is formed in the substrate 201 to expose a portion of the dielectric layer 202. A portion of the dielectric layer 202 is then removed by an etching process (for example, a wet etching process using an etchant containing HF) through the through-hole 201b, the penetrating openings 205c and the vent holes 203a, so as to expose a portion of the dielectric layer 202, a portion of the membrane 203, a portion of the blocking layer 204 and a portion of the backplate 205 and to form a cavity 206 in the dielectric layer 202, a first chamber 207 between the membrane 203 and the substrate 201 and a second chamber 208 between the membrane 203 and the backplate 205 (see FIG. 2D).

Figure 2D:
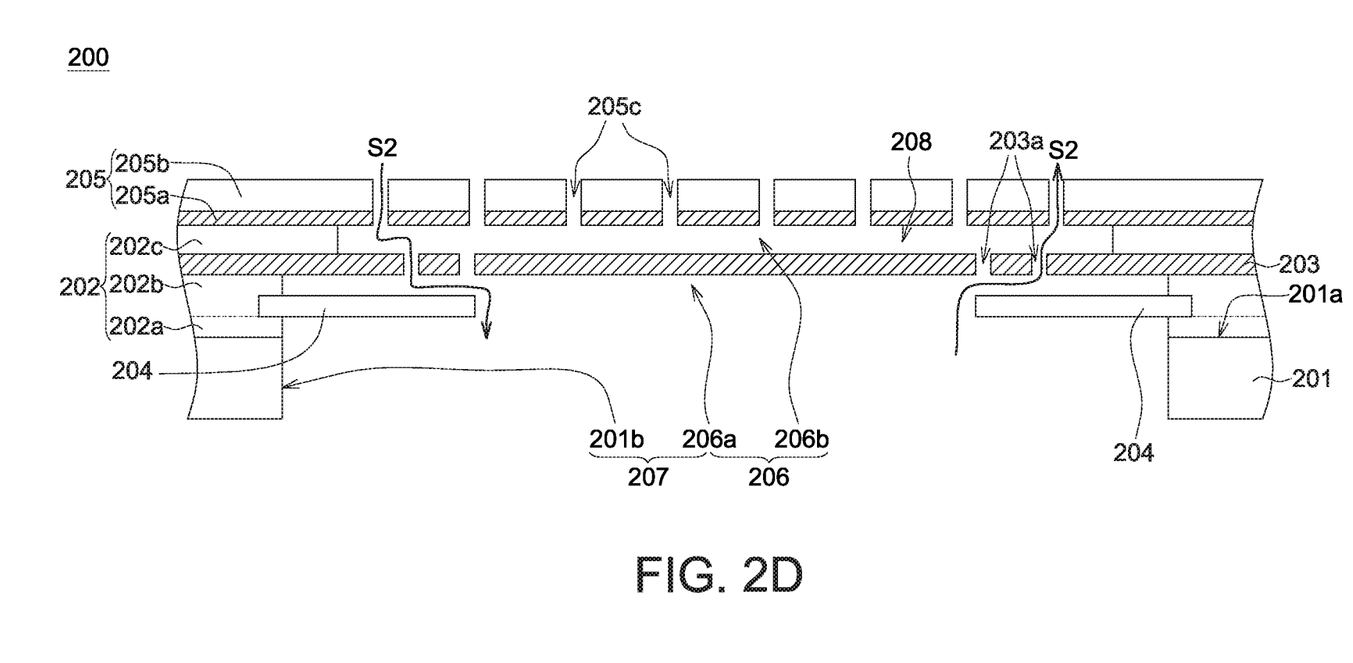

In detail, after the cavity 206 is formed, a portion of the membrane 203 is embedded in the dielectric layer 202; the other portion of the membrane 203 and all of the air holes 203a can be exposed through the cavity 206. The cavity 206 can be divided into two parts, i.e. a first portion 206a between the membrane 203 and the substrate 201 and a second portion 206b between the membrane 203 and the backplate 205, by the exposed portion of the membrane 203. Wherein, the first portion 206a of the cavity 206 communicates with the through-hole 201b to form the first chamber 207; the second portion 206b of the cavity 206 serves as the second chamber 208. In other words, the first chamber 207 is the space defined by the portions of sidewalls of the dielectric layer 202 and the membrane 203 exposed via the cavity 206 and the portion of the sidewalls of the substrate 201 exposed via the through-hole 201b. The chamber 208 is the space defined by the portions of sidewalls of the dielectric layer 202, the membrane 203, and the backplate 205 exposed through the cavity 206.

One end of the blocking layer 204 is embedded in the dielectric layer 202 and the other end of the blocking layer 204 extends into the first chamber 207. Since, when the cavity 206 is formed, the portion of the dielectric film 202b disposed between the blocking layer 204 and the membrane 203 has been removed by the wet etchant passing through the vent holes 203a, thus there is no substantial substance blocking between the first chamber 207 and the second chamber 208, even the vent holes 203a stilly overlap with a portion of the blocking layer 204. Such that, the air S2 in the first chamber 207 and the second chamber 208 can communicate with the external environment via the vent holes 203a, the penetrating openings 205c and the thought-hole 201b. Therefore, the sound pressure can be balanced, and the viscosity of the flowing air between the blocking layer 204 and the membrane 203 as well as the mechanical noise of the MEMS structure 200 can be reduced. Moreover, by the obstacle of the blocking layer 204, the attenuation of the sound pressure can be effectively reduced to alleviate the problem of the low frequency roll-off caused by the vent holes 203a. Therefore, the performance of the MEMS structure 200 can be improved while improving the SNR while taking into account the frequency response.

In accordance with the aforementioned embodiments of the present disclosure, a MEMS device and the method for fabricating the same are provided. A blocking layer is formed between a substrate and a membrane or formed on one side of the membrane away from the substrate to make it not connected to (spatially isolated from) the membrane but at least partially overlapping with at least one vent hole formed in the membrane. Since there is no substantial substance blocking between the blocking layer and the membrane, thus the functions of the vent hole to balance the sound pressure and reduce mechanical noise cannot be affected. Moreover, through the indirect obstacle of the blocking layer, the sound energy dissipation can be delayed and the low frequency roll-off caused by the vent holes can be alleviated. Therefore, the SNR and the performance of the MEMS structure can be significantly improved while taking into account the frequency response.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A micro-electro-mechanical system (MEMS) structure, comprising:
   a substrate, having a through-hole;
   a dielectric layer, disposed on the substrate and having a cavity in communication with the through-hole;
   a membrane, having at least one vent hole, embedded in the dielectric layer, and together with the dielectric layer to define a first chamber that communicates with the through-hole;
   a backplate, disposed on the dielectric layer; and
   a blocking layer, made of a dielectric material other than that of the dielectric layer, wherein one end of the blocking layer is embedded in the dielectric layer, and the other end of the blocking layer extends into the cavity; the blocking layer is spatially isolated from the membrane and at least partially overlaps with the at least one vent hole.

2. The MEMS structure according to claim 1, wherein the membrane is embedded in the dielectric layer, and the other end of the membrane extends into the cavity to divide the cavity into a first portion and a second portion; wherein the first portion communicates with the through-hole to form the first chamber, and the backplate together with the dielectric layer to define a second chamber comprising the second portion.

3. The MEMS structure according to claim 2, wherein the another end of the membrane extends into the cavity extends into the first chamber or the second chamber.

4. The MEMS structure according to claim 2, wherein the first chamber communicates with the second chamber through the at least one vent hole.

5. The MEMS structure according to claim 1, wherein the blocking layer comprises silicon nitride (SiN) or polysilicon; the dielectric layer comprises silicon oxide (SiOx).

6. The MEMS structure according to claim 1, wherein the at least one vent hole is a slit or a through-hole.

7. The MEMS structure according to claim 1, wherein the blocking layer comprises a conductive material and the backplate comprises a conductive layer.

8. The MEMS structure according to claim 1, wherein the blocking layer has a multilayer structure.

9. The MEMS structure according to claim 1, wherein the backplate comprises at least one penetrating opening.

10. A method for fabricating a MEMS structure, comprising:
    forming a dielectric layer on a substrate;
    forming a membrane embedded in the dielectric layer, wherein the membrane has at least one vent hole;
    forming a blocking layer made of a dielectric material other than that of the dielectric layer and embedded in the dielectric layer, wherein the blocking layer is disposed between the substrate and the membrane or disposed on one side of the membrane away from the substrate, is spatially isolated from the membrane and at least partially overlaps the vent hole;
    forming a backplate on the dielectric layer, to make the backplate having at least one penetrating opening and exposing a portion of the dielectric layer;
    forming a through-hole in the substrate to expose a portion of the dielectric layer; and
    removing a portion of the dielectric layer from the through-hole, the at least one penetrating opening and the at least one vent hole to form a first chamber between the membrane and the substrate.

11. The method according to claim 10, wherein the step of removing a portion of the dielectric layer from the through-hole comprises forming a second chamber between the substrate and the membrane, and the second chamber communicates the first chamber through the at least one vent hole.

12. The method according to claim 10, wherein the step of forming the dielectric layer, the membrane and the blocking layer comprises:
    forming a first SiOx layer on the substrate;
    forming a patterned non-SiOx material layer on the first SiOx layer;
    forming a second SiOx layer on the patterned non-SiOx material layer;
    forming a patterned conductive film on the patterned non-SiOx material layer; and forming a third SiOx layer on the patterned conductive film.

13. The method according to claim 12, wherein the non-SiOx material layer comprises SiN or polysilicon.

14. The method according to claim 10, wherein the step of forming the dielectric layer, the membrane and the blocking layer comprises:
   forming a first SiOx layer on the substrate;
   forming a patterned conductive film on the first SiOx layer;
   forming a second SiOx layer on the patterned conductive film;
   forming a patterned non-SiOx material layer on the second SiOx layer; and
   forming a third SiOx layer on the patterned non-SiOx material layer.

15. The method according to claim 14, wherein the non-SiOx material layer comprises SiN or polysilicon.

16. The method according to claim 10, wherein the step for forming the backplate comprises:
   forming a conductive layer on the dielectric layer;
   forming a dielectric protection layer on the conductive layer; and
   patterning the dielectric protection layer and the conductive layer.

17. The method according to claim 10, wherein the step of removing a portion of the dielectric layer from the through-hole comprises a wet etching process.

18. The method according to claim 10, wherein the step of forming the through-hole comprises a dry etching process.

* * * * *